United States Patent [19]

Vincent, Jr.

[11] 3,774,086

[45] Nov. 20, 1973

[54] SOLID STATE LAMP HAVING VISIBLE-EMITTING PHOSPHOR AT EDGE OF INFRATED-EMITTING ELEMENT

[75] Inventor: Charles S. Vincent, Jr., Stuarts Draft, Va.

[73] Assignee: General Electric Company, Schenectady, N.Y.

[22] Filed: Sept. 25, 1972

[21] Appl. No.: 291,767

[52] U.S. Cl....... 317/235 R, 317/234 G, 317/234 H, 317/235 N, 313/108 D

[51] Int. Cl.......................... H01l 11/00, H01l 15/00

[58] Field of Search....................... 317/235, 27, 234, 317/4, 4.1; 313/108 D

[56] References Cited

UNITED STATES PATENTS

| | | | |
|---|---|---|---|
| 3,529,200 | 9/1970 | Potter et al. | 317/235 N |
| 3,534,179 | 10/1970 | Vitkus | 317/235 N |
| 3,562,609 | 2/1971 | Addamiano | 317/235 N |
| 3,596,136 | 7/1971 | Fischer | 317/235 N |
| 3,611,064 | 10/19 71 | Hall et al. | 317/235 N |
| 3,623,907 | 11/1971 | Watts | 317/235 N |
| 3,676,668 | 7/1972 | Collins et al. | 317/235 N |
| 3,696,263 | 10/1972 | Wacher | 317/235 N |

OTHER PUBLICATIONS

"Seeing Red, Yellow and Green"; Electronics by Barnett et al.; May 11, 1970, pages 88 to 93

IBM Technical Bulletin; by Halpin et al., Vol. 15, No. 1, June, 1972, page 316.

*Primary Examiner*—John W. Huckert
*Assistant Examiner*—Andrew J. James
*Attorney*—Norman C. Fulmer et al.

[57] ABSTRACT

A solid state lamp, comprising an infrared-emitting diode mounted to usefully emit infrared radiation from a surface thereof, and a phosphor material placed at or around the edge of the diode to convert edge-emitted infrared energy into visible light, whereby visible light accompanies the emitted infrared thereby visually indicating whether the lamp is on or off and also aiding in focusing or aiming the infrared.

5 Claims, 3 Drawing Figures

SOLID STATE LAMP HAVING VISIBLE-EMITTING PHOSPHOR AT EDGE OF INFRATED-EMITTING ELEMENT

BACKGROUND OF THE INVENTION

The invention is in the field of solid state lamps, and is particularly directed to such lamps employing a p-n junction diode of a material (such as gallium arsenide) which emits infrared energy, in combination with a phosphor material which converts infrared energy into visible light.

Various solid state lamp constructions previously have been devised in which a light-emitting (visible or infra-red) diode is covered with a phosphor or fluorescent material to alter or convert the characteristics of the light emitted by the lamp. U.S. Pat. No. 3,510,732 to Robert Amans (assigned the same as this invention) is directed to such a lamp employing a silicon carbide p-n junction light-emitting diode covered with a plastic lens in which is dispersed a material, such as rhodamine, which shifts the usefully emitted light from a yellow color to a red or orange-red color. U.S. Pat. No. 3,529,200 to Ralph Potter and Simeon Galginaitis (assigned the same as this invention) is directed to a lamp construction employing a light-emitting p-n junction diode of a material, such as gallium arsenide, which emits infrared radiation, and the surface of the diode which usefully emits infrared in the lamp is covered with a phosphor material, such as lanthanum fluoride combined with a suitable activator and sensitizer, which converts infrared into visible light such as green or blue. The thickness and density of the phosphor coating are factors in determining how much infrared energy from the diode accompanies the visible light produced by the phosphor. U.S. Pat. No. 3,573,568 to Harvey Siegel (assigned the same as this invention) is directed to a read-out arrangement of light-emitting p-n junction diodes arranged so that edge-emitted light from the diodes forms a controllable bar-pattern of numerals, etc. The patent discloses such an arrangement in which the light-emitting diodes are gallium arsenide which produce infrared radiation, the diode edges which produce the read-out pattern being coated with a phosphor for producing visible light.

Infrared-emitting solid state lamps have numerous uses, such as in devices for reading punched cards or punched paper tape, and in assembly line or conveyor-belt sensors of various conditions or presence of objects. In such lamps, it often is desirous that the infrared be accompanied by sufficient visible light to aid in aiming and/or focusing the lamp, and also as an indication of whether the lamp is on or off. However, in providing the visible radiation in such an infrared lamp, it is desirable to do so without substantially reducing the intensity of the infrared radiation.

SUMMARY OF THE INVENTION

Objects of the invention are to provide an improved solid state infrared lamp in which a phosphor material is provided to produce visible light, and to provide such a lamp construction in which the placement of the phosphor results in minimal reduction of the usefully emitted infrared radiation.

The invention comprises, basically and in a preferred embodiment, an infrared-emitting element mounted to usefully emit infrared radiation from a surface thereof, and a phosphor material placed at or around the edge of the element to convert edge-emitted infrared into visible light. In a modified embodiment, the infrared-emitting element is mounted in a recess of a support member, and the phosphor material is placed in the recess around the element.

DESCRIPTION OF THE PREFERRED EMBODIMENTS

Figure 1:
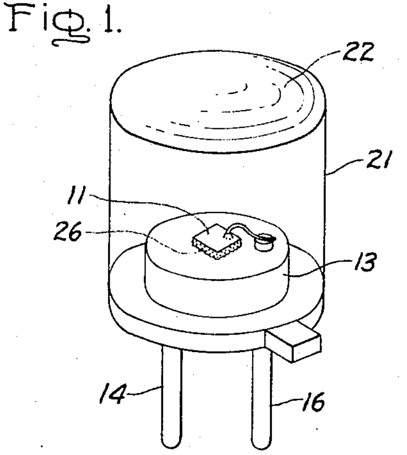
FIG. 1 is a perspective view, showing internal construction, of a lamp in accordance with a preferred embodiment of the invention.
Figure 2:
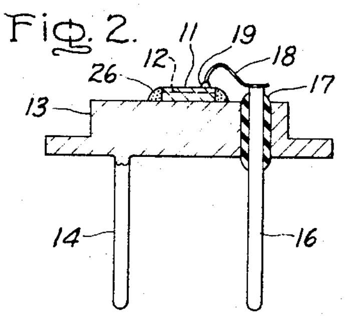
FIG. 2 is a cross-sectional view taken laterally of a portion of FIG. 1.

In the embodiment of FIGS. 1 and 2, an infrared-emitting element 11, such as a crystal on chip of gallium arsenite suitable doped to form a p-n junction 12 therein, is mounted on a metal header 13, the lower surface of the diode chip 11 being electrically and mechanically connected to the header 13. A first lead wire 14 extends downwardly from the header 13, and a second lead wire 16 extends through an opening in the header 13 and is secured to and insulated from the header by means of an insulator 17 of glass or other suitable material. A small connector wire 18 is connected between the upper end of the connector lead 16 and a small-area contact region 19 on the upper surface of the diode 11. A cylindrical cover 21, which may be of metal or plastic, is positioned over and attached to the header 13, and may be provided with an infrared-focusing lens 22 at the upper end thereof. When suitable voltage is applied across the connector wires 14 and 16, current passes through the p-n junction 12 of the diode 11, causing infrared radiation to be usefully emitted upwardly through the top surface of the diode 11, and focused by the lens 22 into a beam of infrared radiation of desired configuration. Further details of the construction thus far described, are disclosed in the above-referenced patent to Potter and Galginaitis.

In accordance with the invention, a phosphor material 26 is positioned at or around the edge or edges of the diode chip 11, and functions to convert infrared emitted from the edge or edges of the diode 11, into visible light. A suitable phosphor material 26 is lanthanum fluoride sensitized and activated by suitable materials, and suspended in a suitable binder such as polystyrene, which may be thinned to a desired consistency with a thinner such as acetone, as is more fully disclosed in the above-referenced Potter and Galginaitis patent. The phosphor material 26 may be dispensed around the edges of the diode 11 by means of a small-bore dispenser tube, and allowed to dry. Alternatively, the phosphor material 26 may be placed over the top 11 and around the edges of the diode 11, the phosphor material on the top surface of the diode 11 then being removed, or substantially removed, by blowing, brushing, or wiping, whereupon the remaining phosphor material 26 around the edges of the diode 11 is allowed to dry. Since the top surface of the header support member 13 has an area larger than that of the diode element 11, it aids in supporting and holding in place the phosphor 26.

From the foregoing, it will be apparent that the invention causes the production of an amount of visible light, due to the presence of the phosphor material 26, which is activated by otherwise unused infrared radiation from the edges of the diode chip 11, without causing any appreciable reduction in the usefully emitted infrared radiation from the upper surface of the diode 11, which radiation, in the embodiment shown in FIG. 1, is suitable focused by the lens 22. Thus, the visible radiation produced by the phosphor material 26 serves as a ready visual indication of whether the diode 11 is on or off, and also aids in focusing or aiming the infrared beam, as focused by the lens 22, onto a desired object or in a desired direction. The amount of visible light radiated along with the infrared radiation, need not necessarily be of sufficient intensity to produce a visible beam as projected from the lens 22, as in many applications the visual on-off indication, and proper aiming or focusing of the infrared, can be determined by looking toward or into the direction of the lens 22.

Figure 3:
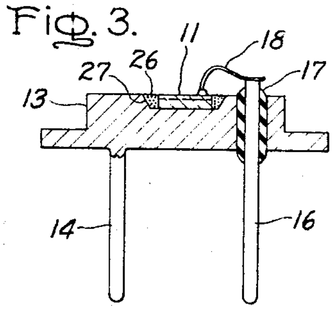
FIG. 3 is a lateral cross-sectional view of an alternative embodiment of the invention.

In the embodiment of FIG. 3, a recess 27 is provided in the upper surface of the metal header 13, and the diode 11 is mounted in this recess, as shown. Preferably, the upper surface of the diode 11 is flush with the upper surface of the header 13, and the outer edge of the recess 27 is spaced somewhat outwardly from the edges of the diode 11. The phosphor material 26 is positioned in the recess 27, surrounding the edges of the diode 11. The phosphor material 26 may be applied in the recess 27 by any of the methods described above, and in certain instances this is facilitated by the phosphor material 26 being in the recess 27, whereby any excess phosphor material on the top surface of the diode 11 may be more readily removed by blowing or wiping or brushing, without removing or disturbing the phosphor material 26 in the recess 27 around the edges of the diode 11. The recess 27 may be provided in a metal tab support member as described in U.S. Pat. No. 3,676,668 to Neil Collins, Elwyn Kerber, and Raymond Neville (assigned the same as this invention).

While preferred embodiments of the invention have been shown and described, various other embodiments and modifications thereof will become apparent to persons skilled in the art, and will fall within the scope of invention as defined in the following claims.

I claim:

1. A visible-infrared solid state lamp comprising an infrared-emitting element arranged to usefully emit infrared radiation from a surface thereof, and also emitting infrared radiation from the edge thereof, a phosphor material positioned adjacent to at least a portion of said edge of the element and having the characteristic of converting said edge-emitted infrared into visible light, and a lens positioned over said infrared-emitting surface and phosphor material, said surface of the element being essentially free of phosphor material so as to radiate infrared radiation unimpededly toward said lens.

2. A lamp as claimed in claim 1, including a support member having a substantially flat surface of greater area than that of said element, and means mounting said element on said flat surface of the support member in a position so that the element lies within the confines of said flat surface, said phosphor material being positioned in contact with at least a portion of said flat surface and said edge of the element.

3. A lamp as claimed in claim 2, including a cover member attached to said support member, said lens being carried by said cover member and positioned over and spaced from said infrared-emitting element and phosphor material.

4. A lamp as claimed in claim 1, including a support member having a substantially flat surface provided with a recess therein, means mounting said element in said recess with the infrared-emitting surface thereof facing outwardly and being substantially parallel to said surface of the support member, the relative sizes of said recess and said element being such that a portion of the recess surrounds the element, said phosphor material being positioned in and filling said portion of the recess.

5. A lamp as claimed in claim 4, in which said surface of the element lies in substantially the same plane as said surface of the support member.

* * * * *